United States Patent [19]

Collins et al.

[11] 4,092,734
[45] May 30, 1978

[54] ANALOGUE MEMORY

[75] Inventors: Dean R. Collins, Dallas; Bill R. Norvell, Richardson, both of Tex.

[73] Assignee: Texas Instruments Incorporated, Dallas, Tex.

[21] Appl. No.: 803,720

[22] Filed: Jun. 6, 1977

Related U.S. Application Data

[63] Continuation of Ser. No. 207,905, Dec. 14, 1971, abandoned.

[51] Int. Cl.² ............................................. G11C 11/40
[52] U.S. Cl. ..................................... 365/238; 357/24; 307/221 C; 307/238; 365/183; 365/189; 365/219
[58] Field of Search .............. 357/24; 307/221 C, 238; 340/173 R, 173 CA

[56] References Cited

U.S. PATENT DOCUMENTS 3,502,992  3/1970  Cooperman ......................... 307/229
3,763,480  10/1973  Weimer ............................ 340/173 R

*Primary Examiner*—Terrell W. Fears
*Attorney, Agent, or Firm*—James T. Comfort; Rene' E. Grossman; William E. Hiller

[57] ABSTRACT

A memory system for analogue data includes a plurality of semiconductor charge device shift registers integrated on a semiconductor substrate. In one embodiment analogue data is serially inputed into a charge-coupled device (CCD) shift register. The serial data is converted to parallel and propagates at a substantially slower speed through a plurality of shift registers. A parallel-to-serial conversion provides a serial readout of the data. The serial-parallel-serial arrangement of the memory significantly reduces the number of transfers required to propagate one bit of data through the memory and provides correspondingly improved outputs. In a different aspect of the invention, a plurality of bits of digital data are transformed into a single analogue signal effecting a reduction in size of the memory for equal storage capability.

4 Claims, 9 Drawing Figures

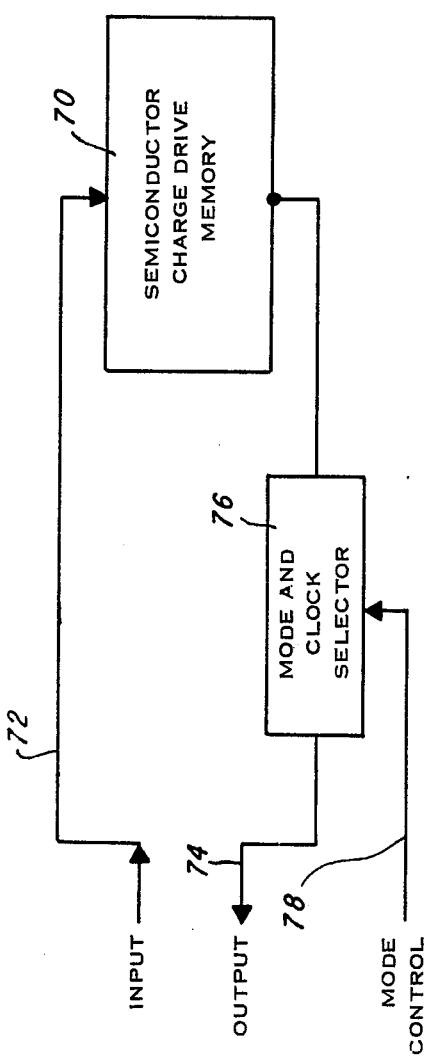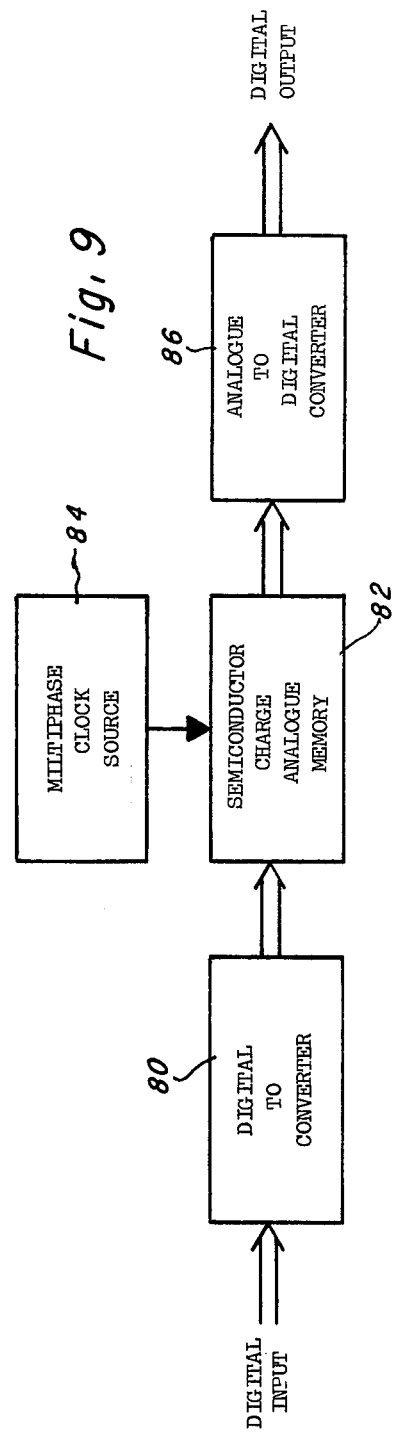

ANALOGUE MEMORY

This is a continuation of application Ser. No. 207,905, filed Dec. 14, 1971, now abandoned.

The present invention pertains to solid state memories in general and more particularly to a memory for analogue signals which memory comprises semiconductor charge device shift register memory units.

A variety of applications require processing of analogue data. In many instances, it would be desirable to store the analogue signal directly in a solid state memory, especially from the view point of reliability and ease of maintance. To date, however, an acceptble non-mechanically rotating solid state memory capable of directly storing analogue signals for long periods of time is not available. The analogue data that is stored in a solid state memory must generally first be converted to a digital code and the digital code stored in the memory. Upon readout of the data, the digital information is reconverted to an analogue format. Such techniques, however, greatly complicate the design of solid state memories and increase the costs.

Accordingly, an object of the present invention is to provide a solid state memory for directly storing analogue signals.

An additional object of the invention is to utilize semiconductor charge devices for storing analogue data.

Another object of the invention is the provision of an analogue memory for storing digital data in analogue format thereby reducing the size of the memory.

Yet another object of the invention is to provide a memory system for storing analogue data which requires relatively little power when data is received in blocks.

A further object is the provision of a serial-parallel-serial configuration semiconductor charge analogue memory having an improved clock system.

Briefly in accordance with the present invention, a memory system for storing analogue data comprises semiconductor charge device analogue shift registers. The semiconductor charge device technology provides the advantage of simplicity of fabrication, high density, high yield, low power, and low cost. Suitable semiconductor charge devices include bucket-brigade configurations of insulated gate field-effect transistors (BB) and semiconductor charge coupled devices (CCD). The semiconductor charge device shift registers are analogue in nature, the quantity of charge stored corresponding to the amplitude of the signal. In accordance with the invention, analogue memories advantageously find application (1) for storage of analogue information where analogue outputs are desired; (2) for temporarily storing analogue information that is to be subsequently digitized; and (3) for storing digital information in analogue form to minimize the memory size. Such memories, by way of example, may be utilized for storing the intensity of a returned radar or sonar signal or the analogue portion of television pictures, such as would be required in an "instant replay" type application; for temporary storage of an optical image prior to digital transmission and for direct storage of digital information in analogue form. For example, utilizing an eight level analogue memory, rather than a digital memory, the memory size may be reduced by a factor of three since three bits of digital information are equivalent to a single eight level analogue signal.

A brief description of phenomenon associated with semiconductor charge devices will facilitate understanding of the present invention. One factor of importance for consideration in semiconductor charge shift registers is the charge transfer efficiency. Basically the charge transfer efficiency determines the number of transfers, that is, the total length of the transfer chain for an analogue data system. When the information is being transferred along the shift register, a portion of the charge is lost. By way of example, it is reported by Bertrim, "Application of the Charge Coupled Device Concept to Solid State Image Sensors" paper 5C.1, IEEE INTERNATIONAL CONVENTION, Mar. 22 – 25, 1971, New York (71C8-IEEE) that a bucket-brigade operating at 5 MHz has a transfer efficiency of approximately 99.7% while charge-coupled devices operated at about 2 MHz have a 99.99% charge transfer efficiency and that at 6.5 MHz they operate with greater than 99.9% charge transfer efficiency.

Generally, the charge transfer efficiency increases as the clock frequency decreases and thus lower clock frequencies increase the charge transfer efficiency. However, at low frequencies the phenomenon of storage time limits operation. That is, the bucket-brigades the source and drain leakage current discharges the bucket potential while in charge-coupled devices the bulk diffusion or the surface state generation current fills the "potential well". The maximum time during which charge can remain in a potential well or at a bucket without degradation is generally referred to as the storage time.

Another consideration relative to memory systems is the amount of power required to operate the system and the access time to the memory. Generally it is desired to minimize both power dissipation and access time. The majority of the power dissipation in insulated gate field-effect-transistor circuits is in the clock power ($CV^2f$). However, since the power dissipation is lineally proportional to the frequency, relatively high dissipation is experienced in, for example, charge-coupled device memories having a relatively fast access time.

With respect, for example, to a charge coupled memory device, the clock drive power requirement to drive a $10^6$ bit memory with a square wave clock pulse of 50 nanosecond rise time is expressed by the relationship $i = CdV/dt$. Assuming a 10 volt clock pulse and a 0.1 picofad capacitance per bit, a current of 20 amps is required. Even though this current is required for only 50 nanoseconds, 20 amps is a great deal of current to supply to a slice through high inductance leads. Moreover, the cross talk caused by the sharp clock transitions is often severe.

In accordance with the invention, a memory system for analogue data comprises a semiconductor charge device shift register defined on a semiconductor substrate and clocking means operably connected to the shift register for propagating the analogue data at a selected clock rate. More particularly, the analogue memory system includes a first section which comprises a semiconductor charge device analogue shift register for serially propagating analogue data at a relatively fast clock rate. A second section includes a plurality of semiconductor charge device analogue shift registers respectively disposed adjacent selected bits of the first shift register, the plurality of shift registers having a relatively low clock rate. Transfer means are included for coupling data from respective bits of the first shift register to corresponding bits of the plurality of shift registers, thus effecting a serial-to-parallel conversion of the analogue data. A third section defines a third semiconductor device analogue shift register having a relatively fast clock rate. The third shift register is disposed such that respective bits thereof are in alignment with corresponding bits of the second plurality of shift registers in the second section. Transfer means are utilized to effect a parallel-to-series conversion of the data. This serial-parallel-serial configuration of analogue memory sections has the advantage of reducing the number of transfers of a bit of data as it propagates through the memory system. For example, in an $n \times n$ memory matrix, a bit of data propagating through the memory requires only $2n$ transfers as contrasted to $n^2$ transfers required in a comparable memory which utilizes only serial propagation. This provides an important advantage in transferring analogue data since a certain amount of the signal is dispersed after each transfer; i.e., the charge transfer efficiency is less than 100%. Another advantage provided by the serial-parallel-serial configuration is that the data propagates through the parallel section at a significantly slower clock rate than through the series section ($1/n$ the rate of the serial section). Since the charge transfer efficiency increases as the frequency decreases, there is a more efficient transfer of charge through the parallel section as contrasted to the series section.

In one aspect of the invention, an analogue data processing system includes means for detecting an analogue signal and providing an output corresponding thereto, an analogue memory operably coupled to the detecting means for storing the analogue data, and output means coupled to the memory means for serially reading out the analogue data. This embodiment of the invention finds particular advantageous use in radar, sonar, and optical systems. In a different embodiment of the invention, a compact digital memory system includes means for converting binary data to a corresponding analogue signal, the amplitude of which corresponds to a selected numeric value, means for coupling the analogue signal to an analogue memory system for storing the analogue data and output means for selectively reading out the analogue signal and converting this signal to binary data corresponding to the selected numeric value.

A feature of the invention is the utilization of a mode switch for controlling application of the clock pulses to the shift registers of the analogue memory system. For example, the mode switch would stop the clocks if no data were desired to be received or outputed for a period of time, i.e., if the data were received in block rather than continuous form. The length of time for which the clocks could be stopped would, of course, have to be less than the storage time. This feature would be particularly advantageous during intervals when battery power is used to operate the memory.

Other novel features, objects, and advantages of the invention will be apparent upon reading the following detailed description of illustrative embodiments of the invention in conjunction with the drawings wherein:

FIG. 8 is a block diagram illustrating a mode selector in combination with an analogue memory of the present invention; and FIG. 9 illustrates in block diagram a memory system for storing digital data in analogue form.

Figure 1:
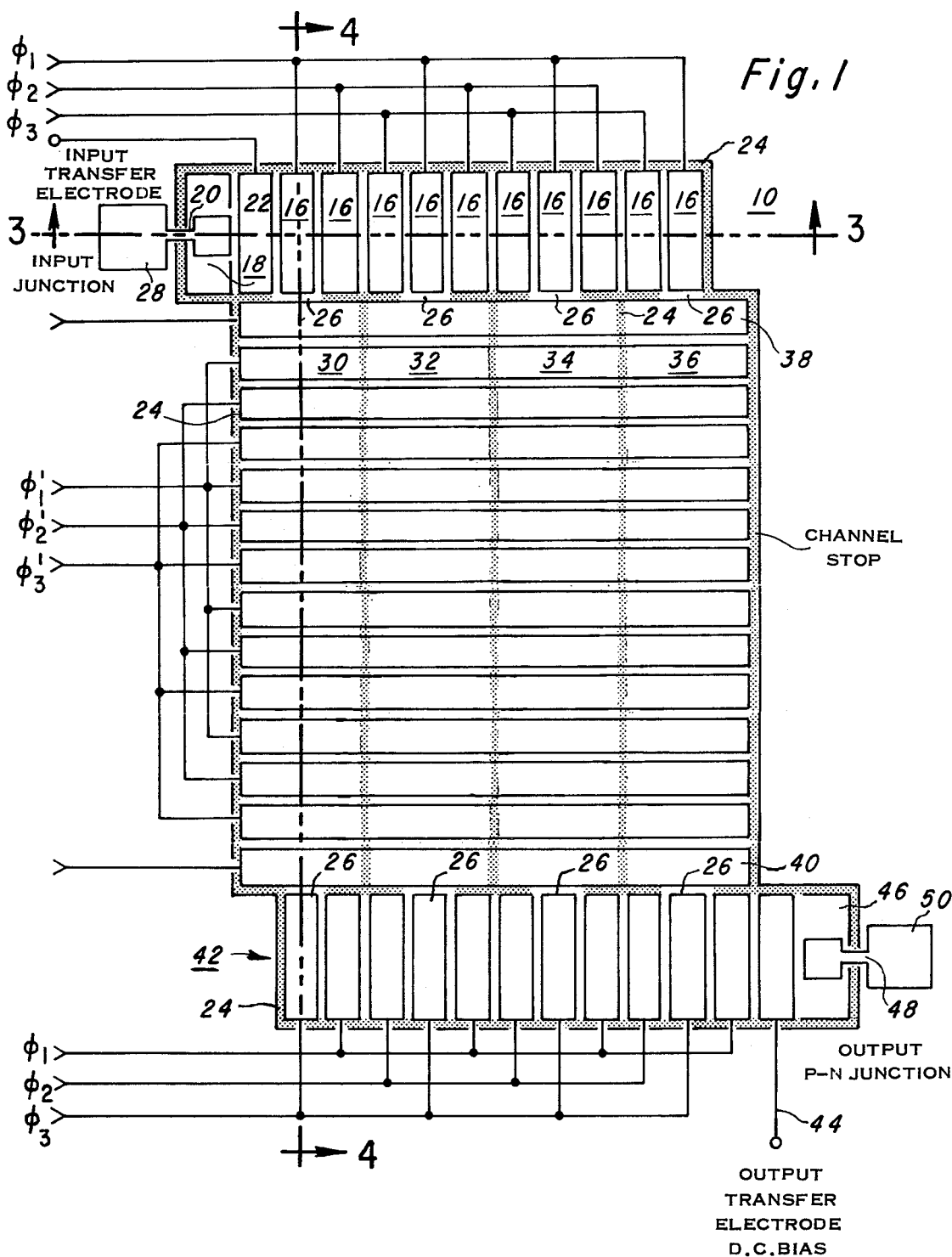
FIG. 1 is a plan view partially in block diagram format illustrating a 20 bit serial-parallel-serial analogue memory in accordance with the present invention.
Figure 2:
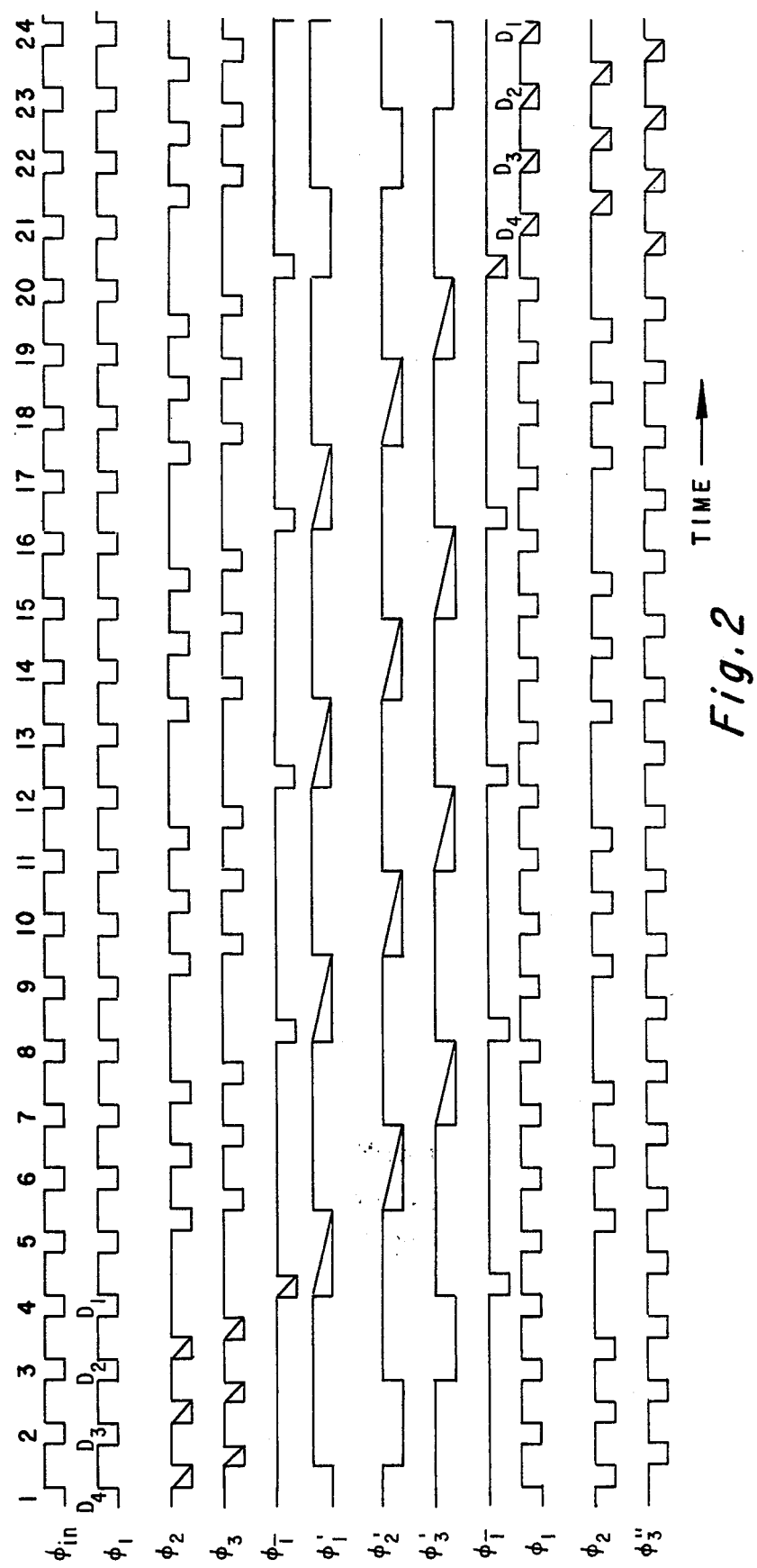
FIG. 2 depicts representative clock pulses which may be utilized to drive the shift registers illustrated in FIG. 1.
Figure 3:
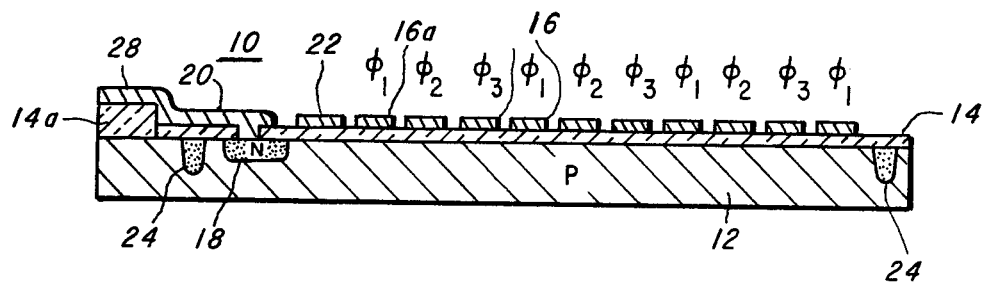
FIGS. 3 and 4 are cross-sectional views of FIG. 1.
Figure 4:
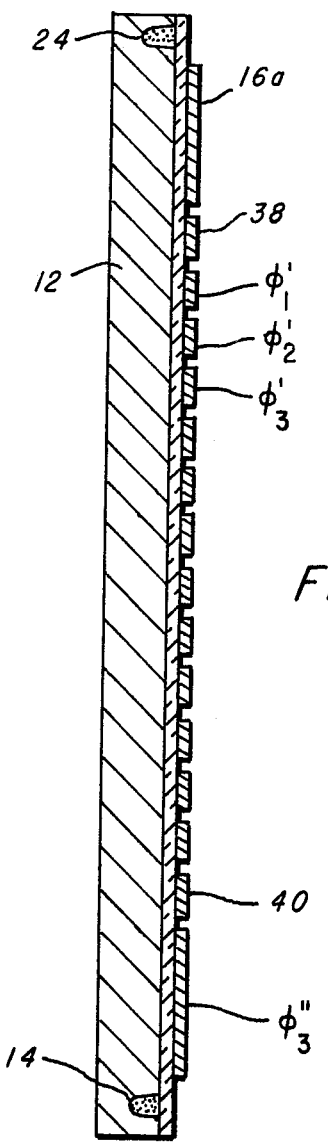

With reference now to the drawings, and for the present to FIGS. 1, 3, and 4, a serial-parallel-serial analogue memory system in accordance with an illustrative embodiment of the present invention is illustrated. A charge-coupled device shift register is illustrated generally at 10 and is defined to overlie a first region of a semiconductor substrate 12. The substrate may, by way of example, comprise P-type silicon, preferably having a resistivity of 50 $\Omega$-cm or greater. It is understood, of course, that a N-type silicon substrate or other semiconductor material substrates may be utilized if desired. A thin insulating layer 14 is formed to overlie one surface of the substrate 12. This insulating layer may, for example, comprise silicon oxide or silicon nitride or a combination of insulating material formed to a thickness generally on the order of about 1,000 A. A plurality of elongated substantially parallel electrodes 16 are defined to overlie the surface of the insulating layer 14. In the embodiment illustrated each set of three successive electrodes defines one bit of the charge-coupled shift register. Three separate clocks, $\phi_1$, $\phi_2$, $\phi_3$, are respectively connected to successive electrodes in a set. Suitable clocks are illustrated in FIG. 2. A region 18 of opposite conductivity type is formed in the surface of the substrate 12. This region may be formed by any of various techniques known to those skilled in the art, such as by ion implantation, diffusion, etc. A conductive lead 20 ohmically contacts the region 18. Input information to the shift register 10 is applied via the conductive lead 20. A transfer electrode 22 is formed to overlie the insulating layer 14 and is disposed intermediate the region 18 and the first electrode 16a of the shift register 10. The transfer electrode 22 is effective to transfer electrical charge stored by the P-N junction capacitance of the region 18 to a potential well underlying electrode 16a. A channel stop region 24 of P+ conductivity type (for the situation where a P-type substrate is utilized) is formed around the periphery of the entire memory and between the parallel data rows. It will be noted (reference FIG. 1) that the region 24 is not formed in regions such as 26 of the semiconductor 12 underlying electrodes 16 which are connected to phase 1 of the clock.

The contact pad 28 for the conductive lead 20 is preferably formed over an expanded area overlying a thick oxide region 14a such as illustrated in FIG. 3.

Four columns of shift registers are illustrated generally at 30, 32, 34 and 36. These shift registers may be similar to the shift register 10 above described. Again each set of three successive electrodes defines one bit of data. These electrodes are respectively biased by a second set of clocks $\phi'_1$, $\phi'_2$, and $\phi'_3$. A transfer electrode 38 is effective to transfer data from respective bits of the shift register 10 into the shift registers 30, 32, 34, and 36.

Electrical charge, i.e., analogue data, is transferred along a surface region of the substrate 10 through the regions 26 where the channel stop regions are not formed. In regions where the channel stop regions are formed, electrical charge is prevented from being transferred inadvertently. The structure of the column shift register 30, for example, may better be seen with reference to FIG. 4.

With reference to FIG. 2, it may be seen that the clock rate of $\phi'_1$, $\phi'_2$, and $\phi'_3$ is substantially less than the clock rate of clocks $\phi_1$, $\phi_2$, and $\phi_3$. This is extremely advantageous in that the power dissipation is reduced and the charge transfer efficiency increased for column shift registers 3, 32, 34 and 36. An additional transfer electrode 40 is effective to transfer the data from the shift registers 30, 32, 34, and 36 into corresponding bits of the shift register shown generally at 42. The shift register 42 may be similar to the shift register 10. Clocks $\phi_1$, $\phi_2$, and $\phi''_3$ are connected to successive electrodes of each set of three electrodes of the shift register 42. An output transfer electrode 44 removes data from the shift register 42. This data is detected by a P-N junction in a region of opposite conductivity type 46 which may, by way of example, be similar to the P-N junction region 18. Ohmic connection is made to the P-N junction by the conductive lead 48 and the output taken from the expanded contact 50.

In the above described embodiment, the serial-parallel-serial memory is illustrated in a three-phase, single-level metallization system. It is appreciated that the memory could also be fabricated using a four-phase, two-level metallization system such as described in co-pending application entitled, "Semiconductor Device and Method of Fabrication" filed Apr. 1, 1971, in the name of Dean R. Collins, et al, Ser. No. 130,358 or other multiphase clocking systems.

In operation of the memory illustrated in FIGS. 1 – 4, three sets of three-phase clocks are utilized. in an N × N matrix the clock used to drive the serial input, such as shift register 10 and serial output, such as shift register 42, would run a "N" times the rate of the internal parallel clocks, $\phi'_1$, $\phi'_2$, and $\phi'_3$. Thus by way of example, in a 100 × 100 matrix with a serial clock rate of 10 MHz the parallel clock rate would only be 100 KHz.

Again, with reference to FIG. 2 it will be noted that the serial-parallel-serial analogue memory operates in a continuous serial data mode, i.e., a continuous stream of analogue data is inputed to and outputed from the memory at all times. The two transfer electrode 38 and 40 are used in the parallel section of the memory to facilitate this operation. In addition, the channel-stop regions 24 are utilized to prevent the transfer of charge at undesired locations. It will be noted (FIG. 2) that certain of the clock pulses of the serial clock are omitted to facilitate operation of the memory similar to a continuously operating shift register. For this situation, the serial clocks must accept and output data without an interruption in the timing cycle. This is accomplished by operating the serial input phase 1 clock ($\phi_1$) and the last electrode phase in the output serial register ($\phi''_3$) at a regular cycle rate. To effect serial-to-parallel and parallel-to-serial conversions and not interrupt the serial data flow or transfer data into undesired locations, certain clock pulses are eliminated. An advantage of the clock forms illustrated in FIG. 2 is the fact that the parallel clocks run continuously; further, there is no transfer time for transferring analogue data which is shorter than the normal serial transfer time. In addition, the two serial-to-parallel and parallel-to-serial transfer electrodes 38 and 40 turn on and off simultaneously. The serial clocks $\phi_1$, and $\phi_2$, for shift registers 10 and 42 are identical; clocks $\phi_3$ and $\phi''_3$ however, are different. It may be seen that the eliminated pulses in clocks $\phi_2$ and $\phi_3$ may easily be removed from a continuous pulse train in accordance with techniques well known to those skilled in the art. For the embodiment illustrated, a signal will come out of an N × N memory after N (N+1) clock cycles after experiencing 2 (3N) + 2 electrode transfers. The above described multiphase clock system, although described with reference to an analogue memory, finds use in other applications such as, e.g., co-pending application Ser. No. 207,906, entitled "Semiconductor Memory for Digital Data," filed 12-14-71 and assigned to the same assignee.

Figure 5:
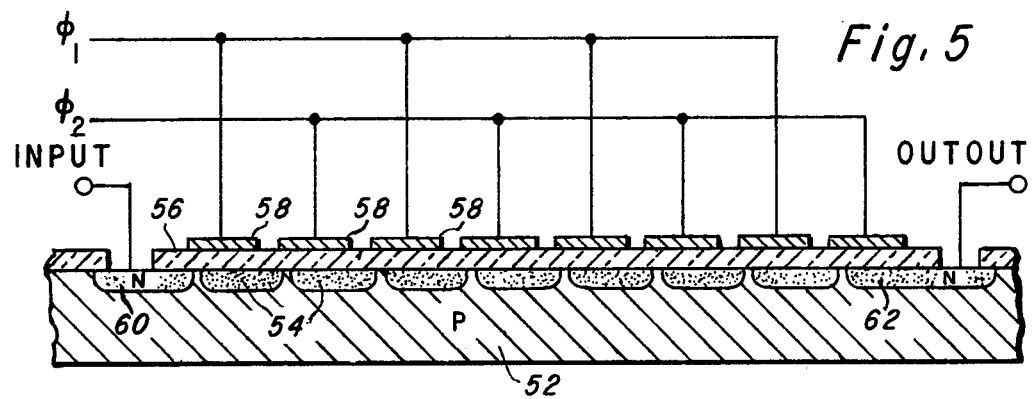
FIG. 5 is a cross-sectional view of a bucket-brigade configured field-effect transistor shift register which may be utilized with the present invention.

With reference to FIG. 5, there is illustrated in cross section a bucket-brigade shift register suitable for use with the present invention. The bucket-brigade includes a semiconductor substrate of one conductivity type such as P-type silicon at 52. Regions of opposite conductivity type as shown generally at 54 and form the source and drain of the insulated gate field-effect transistors. These regions may be formed, for example, by conventional diffusion techniques or by ion implantations, etc. A relatively thin insulating layer 56 of, for example, silicon oxide, silicon nitride or other insulating material may be formed to a thickness of approximately 1,000 A. Conductive electrodes 58 are formed over the insulating layer 56. In the bucket-brigade configuration the gate electrode typically extends over a greater portion of the region 54 of the transistor to enchance miller capacitance and to facilitate storage of electrical charge. It is understood by those skilled in the art that typically data is stored in only every other bucket of the bucket-brigade. Data is inputed and outputed via ohmic contacts in P-N junction regions 60 and 62. Clock pulses $\phi_1$ and $\phi_2$ are successively applied to adjacent gates 58 to effect shift register operation.

Figure 6:
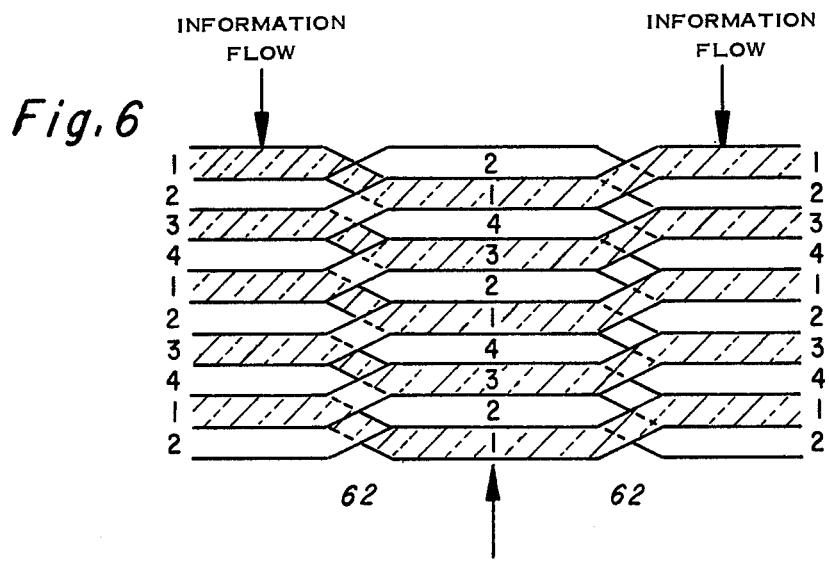
FIG. 6 illustrates in plan view a serpentine configured 4-phase charge coupled device analogue shift register which may be utilized in accordance with the invention to store analogue data.

With reference to FIG. 6, there is illustrated a charge-coupled device structure suitable for storing analogue signals. This structure is a basic serpentine structure and may comprise a four-phase, two-level metallization system utilizing anodized aluminum oxide as the multi-level insulator. This system shifts information serially from one end of the structure to the other by propagating the analogue signal in opposite directions down adjacent rows.

It may be desirable at the cross-over points shown generally at 62 to either form a thick oxide layer (Approximately 10 K A or more) over the substrate in these regions or to form regions or enhanced conductivity type (P+ regions for a P-type substrate) to insure that undesired charge transfer to unwanted locations does not occur.

The bit density is advantageously high and the system is compatible with the four-phase, two-level metallization construction. In an N × N serpentine memory matrix, an analogue signal experiences $N^2$ transfers. Techniques for fabricating such a structure using anodized aluminum as the multilevel insulator and the advantages of such a technique are described in the above referenced co-pending application of Dean R. Collins, et al.

Figure 7:
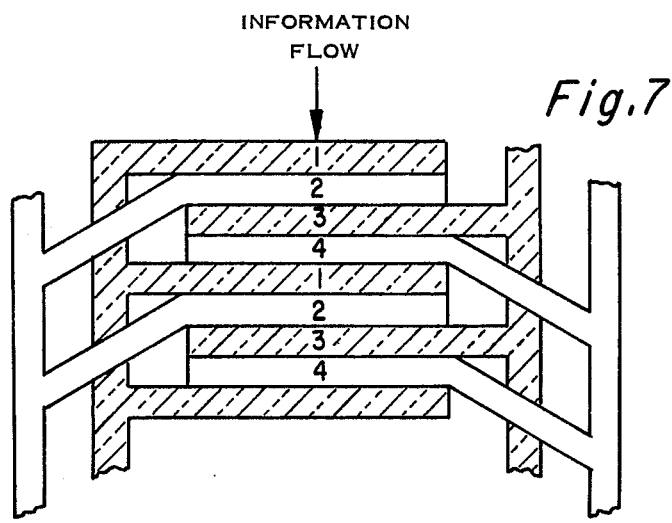
FIG. 7 is a plan view of a 4-phase, charge-coupled device linear array analogue shift register.

With reference to FIG. 7, there is illustrated a linear array electrode configuration which may be utilized to store analogue data. This structure is also compatible with four-phase, two level metallization techniques as above described.

With reference to FIG. 8, there is illustrated a feature of the present invention wherein power requirements are reduced during intervals where access to the memory is not required. A semiconductor charge memory is illustrated at 70. This memory, by way of example, may comprise either a bucket-brigade configuration of shift registers or a semiconductor charge-coupled device configuration of shift registers as described herein. Preferably the memory is configured as illustrated in FIG. 1 in a serial-parallel-serial configuration. The input to the memory 70 is shown at 72 while the output is shown at 74. In accordance with this feature of the present invention, the output is operably connected to a mode and clock selector 76. The mode and clock selector has an input control terminal 76 for selecting at least two modes of operation. one mode of operation provides access to the memory while relatively fast access time is required. The other mode of operation is effective to remove the clocks and hold the associated electrodes at a constant DC bias for an interval less than the storage time of the memory. This mode of operation is advantageous whenever data is received in block form rather than a continuous stream.

With reference to FIG. 9, there is illustrated a system for storing a plurality of digital bits by a single analogue signal. This provides the obvious advantage of reduced size of the memory. By way of illustration, an 8-level analogue signal may be utilized which signal is effective to store a signal corresponding to the information contained in three digital data bits. Thus, immediate savings in memory size is readily apparent. The system includes a digital-to-analogue converter, illustrated in block diagram at 80, for receiving digital input data. Digital-analogue converters are known in the art; a suitable converter, by way of example, is described in Bulletin CA-110, A Texas Instruments Application Report, entitled "A Digital-To-Analog Converter with FET Ladder Switch." The converter 80, provides an analogue output corresponding to the input to a semiconductor charge analogue memory 82. Preferably the memory is a serial-parallel-serial configuration such as illustrated in FIG. 1. A multi-phase clock source 84 provides clocking pulses (such as illustrated in FIG. 2) required by the memory 82. Analogue data is retrieved from the memory 82 and applied to an analogue-to-digital converter 86 to provide the required digital output. A suitable analogue-to-digital converter is described in *Designing with TTL Integrated Circuits,* prepared by the IC Applications staff of Texas Instruments, Inc. and published by McGraw-Hill Book Company (1968)

While the present invention has been described in detail with respect to the description of various embodiments, it will be apparent to those skilled in the art that modifications may be made without departing from the scope or spirit of the present invention.

What is claimed is:

1. An improved charge coupled device memory on a semiconductor substrate comprising first charge coupled serial shift register means having a plurality of serially disposed multi-phase electrodes for propagating charge packets serially through said first register; second charge coupled serial shift register means having a plurality of serially disposed multi-phase electrodes for propagating charge packets serially through said second register; a plurality of charge coupled parallel shift registers having parallel inputs aligned with and spaced apart from electrodes of a selected phase of said first register, a plurality of multi-phase electrodes for propagating charge packets in parallel through said parallel registers, and parallel outputs aligned with and spaced apart from electrodes of a selected phase of said second register, the improvement comprising first transfer electrode means in said space between said first serial register and said parallel register inputs for transferring charge packets in parallel therebetween, and second transfer electrode means in said space between said parallel register outputs and said serial register for tranferring charge packets in parallel therebetween, wherein said first and second transfer electrodes are electrically isolated and independently operable from said phase electrodes of said first, second, and parallel registers.

2. An improved charge coupled device memory according to claim 1 further including clocking means coupled to said transfer electrodes and said phase electrode of said parallel registers for generating thereon transfer electrode clock pulses and parallel phase electrode clock pulses respectively, wherein said transfer electrode clock pulses have a pulse width substantially smaller than said parallel phase electrode clock pulses.

3. A charge coupled device digital memory having increased storage capacity comprising on a semiconductor substrate a charge coupled serial-parallel shift register having input means for injecting charge packets of a size proportional to the magnitude of multi-level input signals applied thereto and electrode means for propagating said charge packets serially along said shift register, a plurality of parallel charge coupled shift registers having input means for receiving said charge packets in parallel from said serial-parallel shift register and electrode means for propagating said packets in parallel through said parallel registers to parallel outputs thereon, a charge coupled parallel-serial shift register having parallel input means coupled to said parallel register outputs for receiving said charge packets in parallel therefrom and electrode means for serially shifting said packets to output means within said parallel-serial register for sequentially generating multilevel output signals of magnitude proportional to the magnitude of said charge packets, the improvement comprising digital-to-analog converter means having an input for receiving groups of N digital input bits and an output coupled to said serial-parallel register input means for generating thereon said multilevel input signal for each group of N input bits with said level being proportional to the binary value of said group of bits, and analog-to-digital converter means having an input coupled to receive said multilevel output signals of said parallel-serial register for recovering each level of said multilevel output signal to a group of N digital output bits.

4. A memory according to claim 3 wherein said plurality of parallel charge coupled shift registers includes input transfer electrode means and output transfer electrode means for respectively activating a transfer of said charge packets from said serial-parallel shift register and to said parallel-serial shift register independently of said propagation of said charge packets through said parallel shift registers.

* * * * *